United States Patent
Bradley et al.

(10) Patent No.: US 8,063,717 B2
(45) Date of Patent: Nov. 22, 2011

(54) DUPLEXER HAVING RESONATOR FILTERS

(75) Inventors: Paul Bradley, Los Altos, CA (US); Shen Ye, Cupertino, CA (US); Ji-Fuh Liang, San Jose, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 294 days.

(21) Appl. No.: 12/509,863

(22) Filed: Jul. 27, 2009

(65) Prior Publication Data

US 2011/0018653 A1   Jan. 27, 2011

(51) Int. Cl.
*H03H 9/48* (2006.01)
*H03H 9/54* (2006.01)

(52) U.S. Cl. ........................ 333/133; 333/189
(58) Field of Classification Search ............... 333/133, 333/187, 189, 191, 192, 193
See application file for complete search history.

(56) References Cited

U.S. PATENT DOCUMENTS

| | | | |
|---|---|---|---|
| 6,262,637 B1 | 7/2001 | Bradley et al. | |
| 6,369,672 B1 * | 4/2002 | Ikada | 333/193 |
| 6,903,631 B2 * | 6/2005 | Kushitani et al. | 333/193 |
| 6,927,649 B2 * | 8/2005 | Metzger et al. | 333/193 |
| 7,116,187 B2 * | 10/2006 | Inoue | 333/193 |
| 7,180,467 B2 | 2/2007 | Fabrega-Sanchez et al. | |
| 7,289,008 B2 | 10/2007 | Kuroki et al. | |
| 7,301,420 B2 * | 11/2007 | Yamaguchi et al. | 333/133 |
| 7,339,445 B2 | 3/2008 | Aigner et al. | |
| 7,403,082 B2 | 7/2008 | Kearns | |
| 7,498,899 B2 | 3/2009 | Iwaki et al. | |
| 7,501,912 B2 | 3/2009 | Jamneala et al. | |
| 7,808,935 B2 | 10/2010 | Koga et al. | |
| 7,821,357 B2 * | 10/2010 | Heinze et al. | 333/133 |
| 2005/0073375 A1 | 4/2005 | Sul et al. | |
| 2006/0139121 A1 | 6/2006 | Jhung | |
| 2007/0046395 A1 | 3/2007 | Tsutsumi et al. | |
| 2008/0079648 A1 | 4/2008 | Forstner et al. | |
| 2008/0100397 A1 | 5/2008 | Nam et al. | |
| 2009/0149136 A1 | 6/2009 | Rofougaran | |
| 2010/0150075 A1 * | 6/2010 | Inoue et al. | 370/328 |
| 2011/0018653 A1 | 1/2011 | Bradley | |
| 2011/0018654 A1 * | 1/2011 | Bradley et al. | 333/133 |

OTHER PUBLICATIONS

U.S Appl. No. 12/627,122, filed Nov. 30, 2009, Fritz, Martin.
Byeoungju, Ha "Novel 1-Chip FBAR Filter for Wireless Handsets", *The 13th International Conference on Solid-State Sensors, Actuators and Microsystems*, vol. 2 Jun. 5-9, 2005, 2069-2073.

* cited by examiner

*Primary Examiner* — Dean Takaoka

(57) ABSTRACT

A duplexer interfacing a receiver and a transmitter with an antenna includes first and second filters. The first filter includes at least four first series resonators, four first shunt resonators respectively connected between the four first series resonators and ground voltage, and a mutual inductance commonly connected between two adjacent first shunt resonators. The second filter includes at least four second series resonators, four second shunt resonators respectively connected between the four second series resonators and the ground voltage, and a cross-coupling capacitor connected between a first capacitor node connected to at least one of the second series resonators and a second capacitor node connected to one of the second shunt resonators, and an inductor connected in series between second capacitor node and ground. Three of the second series resonators and the second shunt resonator to which the cross-coupling capacitor is connected are between the first and second capacitor nodes.

20 Claims, 10 Drawing Sheets

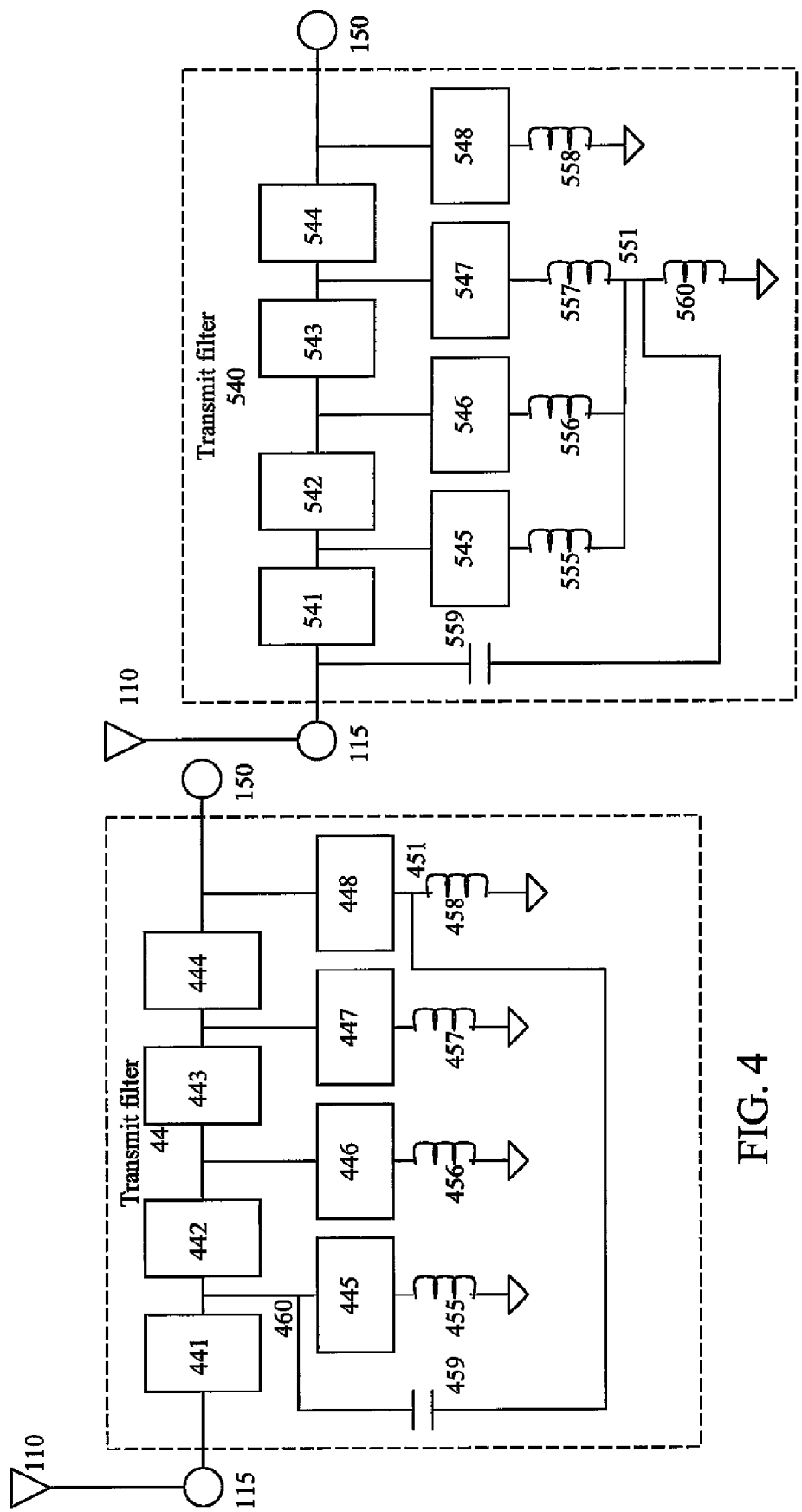

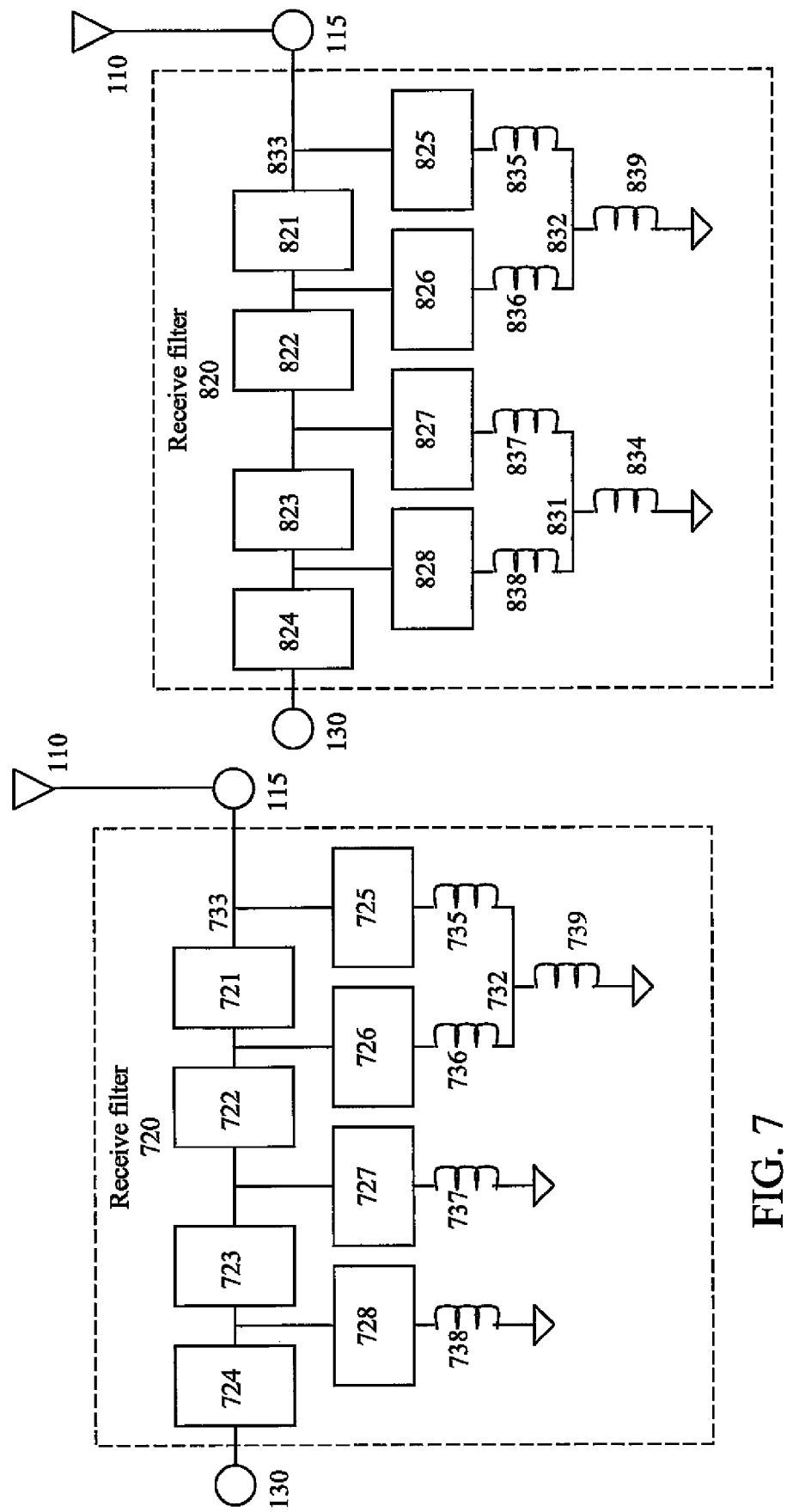

DUPLEXER HAVING RESONATOR FILTERS

BACKGROUND

Portable communication devices, such as cellular telephones, personal digital assistants (PDAs), electronic gaming devices, laptop computers and the like, are configured to communicate over wireless networks. Accordingly, each such portable communication device relies on a transmitter and receiver (or transceiver), typically connected to a single or common antenna, for sending and receiving data and control signals over the wireless network. In order to use the common antenna, a duplexer is included to interface between the common antenna and each of the transmitter and receiver, so that the transmitter is able to send signals on a transmit frequency and the receiver is able to receive signals on a different receive frequency. Generally, the duplexer includes two band-pass filters having different passbands for filtering the transmit and receive signals, respectively, thus preventing or reducing interference between the transmit and receive signals.

Various types of wireless network are implemented according to different communication standards, such as universal mobile telecommunications system (UMTS), global system for mobile communication (GSM), personal communications services (PCS), digital cellular system (DCS), international mobile telecommunication (IMT), and enhanced data rates for GSM evolution (EDGE). The communication standards identify separate bands for transmitting (uplink) and receiving (downlink) signals. For example, UMTS band 2 (PCS) provides an uplink frequency band of 1850 MHz-1910 MHz and a downlink frequency band of 1930 MHz-1990 MHz; UMTS band 3 (DCS) provides an uplink frequency band of 1710 MHz-1785 MHz and a downlink frequency band of 1805 MHz-1880 MHz; UMTS band 7 (IMT-E) provides an uplink frequency band of 2500 MHz-2570 MHz and a downlink frequency band of 2620 MHz-2690 MHz; and UMTS band 8 (GMS-900) provides an uplink frequency band of 880 MHz-915 MHz and a downlink frequency band of 925 MHz-960 MHz. Accordingly, a duplexer operating in compliance with a UMTS standard would include a transmit filter having a passband within the corresponding uplink frequency band, and a receive filter having a passband within the corresponding downlink frequency band.

Demand for smaller, less expensive and more efficient portable communication devices is significant. Therefore, reducing size and weight of portable communication devices, as well as reducing fabrication costs and increasing product yield, are priorities. For example, there is demand for the band-pass filters of duplexers in portable communication devices to be smaller, to consume less power, to have improved performance characteristics (such as lower insertion loss and higher out-of-band attenuation), and to operate at higher frequencies. Such duplexers may include resonators for filtering the transmit and receive signals, such as a thin film bulk acoustic resonators (FBARs). However, design and fabrication are difficult, e.g., due to passband and stopband requirements of the corresponding receive and transmit band-pass filters, and matching circuit requirements between the band-pass filters and the antenna.

SUMMARY

In a representative embodiment, a duplexer interfacing a receiver and a transmitter with a common antenna includes first and second filters. The first filter includes at least four first series resonators connected in series between the antenna and one of the receiver and the transmitter, four first shunt resonators respectively connected between at least one of the four first series resonators and ground voltage, and a mutual inductance commonly connected between two adjacent first shunt resonators. The second filter includes at least four second series resonators connected in series between the antenna and one of the transmitter and the receiver, four second shunt resonators respectively connected between at least one of the four second series resonators and the ground voltage, and a cross-coupling capacitor connected between a first capacitor node connected to at least one of the second series resonators and a second capacitor node connected to one of the second shunt resonators, and an inductor connected in series between second capacitor node and ground. Three of the at least four second series resonators and the one of the second shunt resonators to which the cross-coupling capacitor is connected are positioned between the first capacitor node and the second capacitor node.

In another representative embodiment, a duplexer includes an antenna terminal connected to an antenna, a transmit terminal connected to a transmitter configured to send a transmit signal through the antenna terminal, and a receive terminal connected to a receiver configured to receive a receive signal through the antenna terminal. The duplexer further includes a transmit ladder filter connected between the antenna terminal and the transmit terminal, and a receive ladder filter connected between the antenna terminal and the receive terminal. The transmit filter includes first through fourth transmit series resonators connected in series between the antenna terminal and the transmit terminal, first through fourth transmit shunt resonators respectively connected between the first through fourth transmit series resonators and a ground voltage, and a cross-coupling capacitor connected between the third transmit shunt resonator and the antenna terminal. The receive filter includes a phase shifter and first through fourth receive series resonators connected in series between the phase shifter and the receive terminal, first through fourth receive shunt resonators respectively connected between the first through fourth receive series resonators and the ground voltage, and a common ground inductor commonly connected between the ground voltage and the third and fourth receive shunt resonators. The cross-coupling capacitor shifts a transmission zero of the transmit signal toward a center frequency of a receive passband of the receive filter.

In another representative embodiment, a duplexer for interfacing a receiver and a transmitter with a common antenna includes a receive ladder filter, connected between the antenna and the receiver, and a transmit ladder filter, connected between the antenna and the transmitter. The receive ladder filter includes receive series resonators and receive shunt resonators. A first receive shunt resonator includes a first electrode connected between the antenna and a first series resonator and a second electrode connected to ground; a second receive shunt resonator includes a third electrode connected between the first receive series resonator and a second receive series resonator and a fourth electrode connected to ground; a third receive shunt resonator includes a fifth electrode connected between the second receive series resonator and a third receive series resonator and a sixth electrode connected to a common ground inductor; and a fourth receive shunt resonator includes a seventh electrode connected between the third receive series resonator and a fourth receive series resonator and an eighth electrode connected to the common inductor, the common inductor being connected to ground. The transmit ladder filter includes transmit series resonators and transmit shunt resonators. A first transmit shunt resonator includes a first electrode connected between a first transmit series resonator and a second transmit series resonator and a second electrode connected to ground; a second transmit shunt resonator includes a third electrode connected between the second transmit series resonator and a third transmit series resonator and a fourth electrode connected to ground; a third transmit shunt resonator includes a fifth electrode connected between the third receive series resonator and a fourth transmit series resonator and a sixth electrode connected to a capacitor node; and a fourth transmit shunt resonator includes a seventh electrode connected between the fourth transmit series resonator and the transmitter and an eighth electrode connected to ground. The capacitor node is connected to ground through an inductor and to the antenna via a cross-coupling capacitor.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 4 is a circuit diagram illustrating a transmit resonator filter, according to a representative embodiment.

FIG. 5 is a circuit diagram illustrating a transmit resonator filter, according to a representative embodiment.

FIG. 7 is a circuit diagram illustrating a receive resonator filter, according to a representative embodiment.

FIG. 8 is a circuit diagram illustrating a receive resonator filter, according to a representative embodiment.

DETAILED DESCRIPTION

Figure 1:
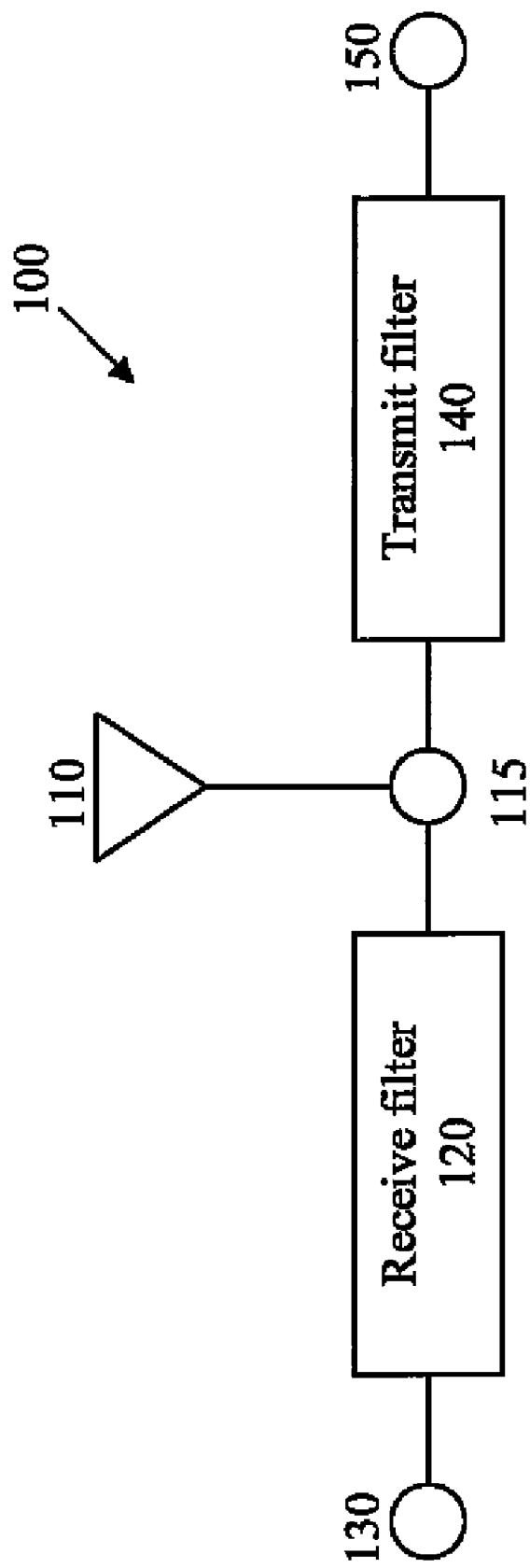
FIG. 1 is a block diagram illustrating a duplexer with resonator filters, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

FIG. 1 is a block diagram illustrating a duplexer having resonator band-pass filters, according to a representative embodiment.

Referring to FIG. 1, duplexer 100 interfaces a receiver (not shown) and a transmitter (not shown) with a common antenna 110, for receiving and sending wireless communications signals. The wireless communications signals may be radio frequency (RF) signals, for example, complying with various communication standards, examples of which are discussed above.

In the depicted representative embodiment, the duplexer 100 includes receive filter 120 connected between the receiver through receiver terminal 130 and antenna 110 through antenna terminal 115, and transmit filter 140 connected between the transmitter through transmitter terminal 150 and the antenna terminal 115 through the antenna terminal 115. The receive filter 120 band-pass filters downlink signals passing through the antenna 110 to the receiver, and the transmit filter 140 band-pass filters uplink signals sent from the transmitter through the antenna 110. The duplexer 100 may be incorporated into any type of portable communication device, such as a cellular telephone, PDA, electronic gaming device, laptop computer and the like.

Figure 2:
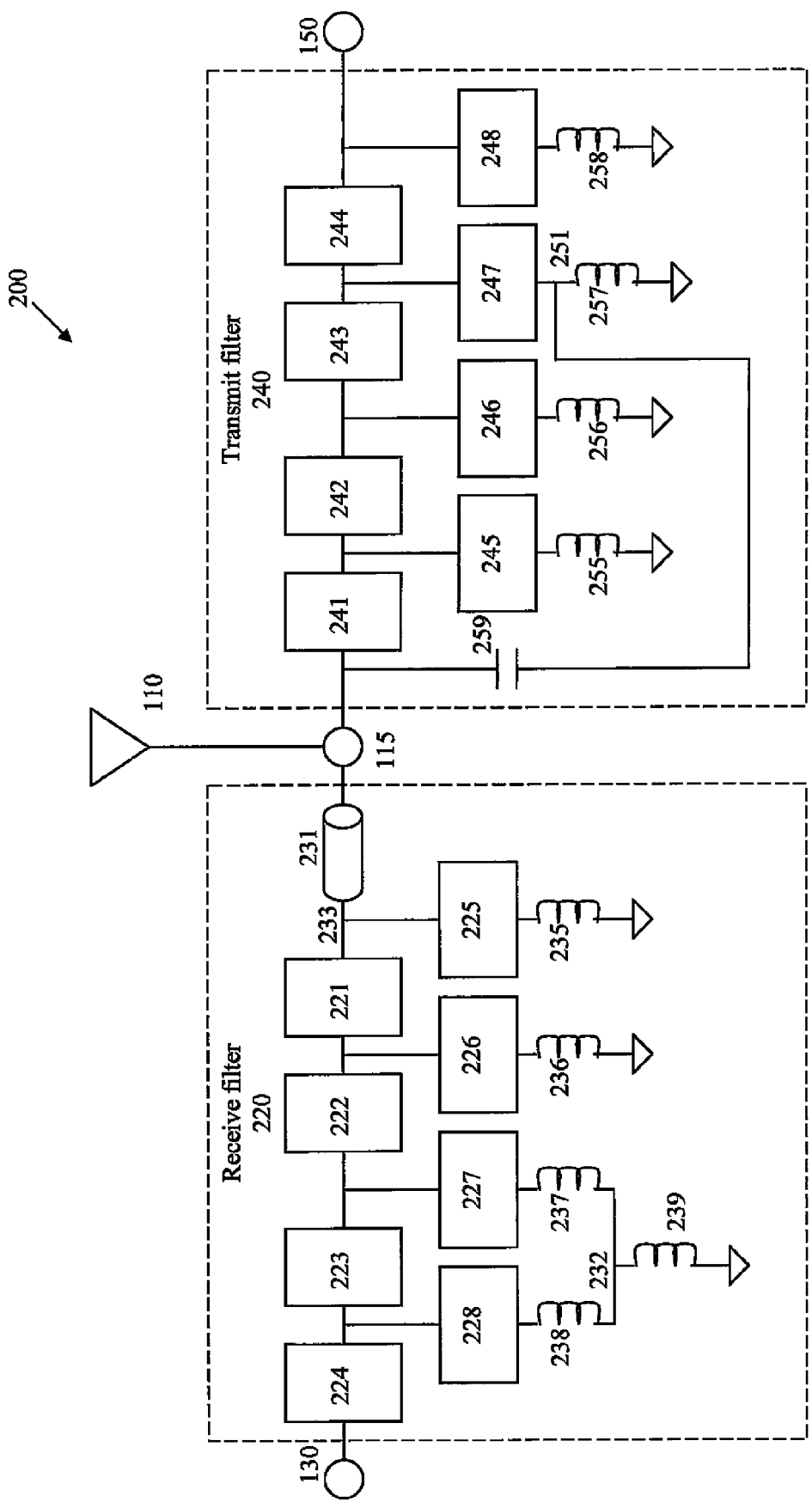
FIG. 2 is a circuit diagram illustrating a duplexer with transmit and receive resonator filters, according to a representative embodiment.

FIG. 2 is a circuit diagram illustrating the duplexer having illustrative first and second resonator band-pass filters, as discussed with reference to in FIG. 1, according to a representative embodiment.

More particularly, duplexer 200 is shown as including a first filter, referred to for convenience of discussion as transmit filter 240, and a second filter, referred to for convenience of discussion as receive filter 220, each of the first and second filters having half-ladder topology. It is understood that in various embodiments, the first and second filters may be reversed, such that the first filter is a receive filter, e.g., connected to a receiver, and the second filter is a transmit filter, e.g., connected to a transmitter, without departing from the scope of the disclosure.

The transmit and receive filters 240 and 220 are configured with resonators 241-248 and 221-228, respectively, according to the depicted embodiments. It is understood, however, that alternative embodiments of the duplexer 200 may include other configurations of transmit and receive filters, for example, as shown in FIGS. 4, 5, 6A and 6B (depicting representative embodiments of transmit filters 440, 540, 640*a* and 640*b*, respectively), and in FIGS. 7, 8, 9A and 9B (depicting representative embodiments of transmit filters 720, 820, 920*a* and 920*b*, respectively), without departing from the scope of the present teachings. It is further understood that alternative embodiments of the duplexer 200 may combine any representative embodiment of transmit filter with any representative embodiment of the receive filter.

Referring to FIG. 2, the receive filter 220 is a ladder type filter having multiple series and shunt resonators 221-228 (discussed below). Each of the series and shunt resonators 221-228 may be a bulk acoustic wave (BAW) resonator such as a film bulk acoustic resonator (FBAR) or a solidly mounted resonator (SMR), for example, and includes a thin film piezoelectric layer formed in a stacked structure between top and bottom electrodes. The thin film piezoelectric layer may be formed of a material such as aluminum nitride, lead zirconate titanate (PZT), or other film compatible with semiconductor processes. In an embodiment, the receive series and shunt resonators 221-228 are fabricated using a common layer of piezoelectric material. The top and bottom electrodes may be formed of any conductive metal compatible with semiconductor processes, such as molybdenum, tungsten, aluminum or the like. Alternatively, each of the series and shunt resonators 221-228 may be a surface acoustic wave (SAW) resonator. In addition to being incorporated into a duplexer, the receive filter 220 may be used as stand alone band-pass filter or may be incorporated in multiplexers or other devices. The receive filter 220 has a series circuit including phase shifter 231 and first through fourth series resonators 221-224 connected in series between the antenna terminal 115 and the receiver terminal 230. The phase shifter 231 is configured to provide phase shifting between 60 and 120 degrees, depending on the ladder filter characteristics of the receive and transmit filters 220 and 240 in the duplexer 200. In various embodiments, the phase shifter 231 may be replaced by shunt inductance matching circuit (not shown), for example, where the downlink and uplink frequency bands are more than about 1 percent apart. The receive filter 220 also has shunt circuits which respectively include first through fourth shunt resonators 225-228 and corresponding first through fourth inductors 235-238 generally connected between the series circuit and ground voltage. In an embodiment, the series and shunt resonators 221-228 have the same coupling coefficient.

More particularly, in the depicted representative embodiment, first shunt resonator 225 has one end (e.g., top electrode) connected between the phase shifter 231 and first series resonator 221 at node 233 and an opposite end (e.g., bottom electrode) connected to ground through inductor 235. Second shunt resonator 226 has one end connected between first and second series resonators 221 and 222 and an opposite end connected to ground through inductor 236. Third shunt resonator 227 has one end connected between second and third series resonators 222 and 223 and an opposite end connected to mutual inductance node 232 through inductor 237. Similarly, fourth shunt resonator 228, which is connected closest to the receiver terminal 230, has one end connected between third and fourth series resonators 223 and 224 and an opposite end connected to the mutual inductance node 232 through inductor 238. The mutual inductance node 232 is connected to ground through mutual or common ground inductor 239. In various embodiments, the common ground inductor 239 may be replaced by another mutual inductance between current paths of adjacent shunt resonators from among the shunt resonators 225-228. Examples of alternative configurations are discussed below with reference to FIGS. 7, 8, 9A and 9B.

The transmit filter 240 is also a ladder type filter, having multiple series and shunt resonators 241-248 (discussed below). Each of the series and shunt resonators 241-248 may be an FBAR, for example, including a thin film piezoelectric layer formed in a stacked structure between top and bottom electrodes. The thin film piezoelectric layer may be formed of a material such as aluminum nitride, PZT or other film compatible with semiconductor processes. In an embodiment, the series and shunt resonators 241-248 are fabricated using a common layer of piezoelectric material. Also, in an embodiment, the series and shunt resonators 241-248, as well as the series and shunt resonators 221-228 of the receive filter 220, may be fabricated using a common layer of piezoelectric material. The top and bottom electrodes may be formed of any conductive metal compatible with semiconductor processes, such as molybdenum, tungsten, aluminum or the like. In addition to being incorporated into a duplexer, the transmit filter 240 may be used as stand alone band-pass filter or may be incorporated in multiplexers or other devices.

The transmit filter 240 has a series circuit including first through fourth transmit filter series resonators 241-244 connected in series between the antenna terminal 115 and the transmitter terminal 150. The transmit filter 240 also has shunt circuits which respectively include first through fourth shunt resonators 245-248 and corresponding first through fourth inductors 255-258 generally connected between the series circuit and ground voltage. In an embodiment, the series and shunt resonators 241-248 of the transmit filter 240 have the same coupling coefficient, which may or may not also be the same coupling coefficient as the series and shunt resonators 221-228 of the receive filter 220. Use of minimum coupling coefficients with respect to series and shunt resonators 221-228 and/or 241-248 enables reduction in die size.

More particularly, in the depicted representative embodiment, first shunt resonator 245 has one end (e.g., top electrode) connected between first and second series resonators 241 and 242, and an opposite end (e.g., bottom electrode) connected to ground through inductor 255. Second shunt resonator 246 has one end connected between second and third series resonators 242 and 243 an opposite end connected to ground through inductor 256. Third shunt resonator 247 has one end connected between third and forth series resonators 243 and 244 and an opposite end connected to capacitance node 251. The capacitance node 251 is connected to ground through inductor 257 and to the antenna node 115 through cross-coupling capacitor 259. Fourth shunt resonator 248, which is connected closest to the transmitter terminal 150, has one end connected between fourth series resonator 244 and the transmitter terminal 150, and an opposite end connected to ground through inductor 258.

Stated more generally, in various embodiments, the cross-coupling capacitor 259 is connected between one of a first node connected to at least one of the series resonators 241-244 (e.g., series resonator 241) and a second node connected to one of the shunt resonators 245-248 (e.g., shunt resonator 247). Between the first and second nodes, there are three series resonators (e.g., series resonators 241-243) and one shunt resonator (e.g., shunt resonator 247). The second node (e.g., capacitance node 251) is separated from the ground voltage by an inductor (e.g., inductor 257). Examples of alternative configurations are discussed below with reference to FIGS. 4, 5, 6A and 6B.

In an embodiment, the common ground inductor 239 and/or the inductors 235-238 of the receive filter 220 are fabricated on a common substrate with the receive series and shunt resonators 221-228, but these inductors could also be implemented as traces on an organic or ceramic substrate with or without wirebonds. Likewise, in an embodiment, the cross-coupling capacitor 259 and/or the inductors 255-258 of the transmit filter 240 are fabricated on a common substrate with the transmit series and the shunt resonators 241-248, which may or may not be the same common substrate of the receive filter 220. The inductors may also be implemented on an organic or ceramic substrate with or without wire bonds. Also, in an embodiment, the receive and transmit filters 220 and 240 are integrally mounted in the same package.

The center frequencies of the passbands for the receive filter 220 and the transmit filter 240 are offset from one another, reducing or avoiding overlap of the respective passbands. The center frequencies are selected to be within the downlink and uplink frequency bands of the applicable communication standard, respectively. For example, in accordance with the GSM-900 standard, the available frequency band for the receive filter 220 is 925 MHz-960 MHz and the available frequency band for transmit filter 240 is 880 MHz-915 MHz. Thus, for purposes of illustration only, it may be assumed that the passband center frequency of the receive filter 220 is about 943.3 MHz and the passband center frequency of the transmit filter 240 is about 887.2 MHz. However, it is understood that the various embodiments may incorporate different standards, or may include different center frequencies and/or passbands in accordance with the GSM-900 standard, without departing from the scope of the present teachings.

Referring again to FIG. 2, the common ground inductor 239 of the receive filter 220 shifts a transmission zero of the received (downlink) signal downward, below the passband of the receive filter 220, into the middle of its stopband. The value of the common ground inductor 239 determines how far the transmission zero is shifted down in frequency from the passband edge. For example, in an embodiment, the value of the common ground inductor 239 is selected such that the transmission zero will be shifted to at or near the center frequency of the passband of the transmit filter 240.

Similarly, the cross-coupling capacitor 259 of the transmit filter 240, together with the third inductor 257, shifts a transmission zero of the transmitted (uplink) signal higher, above the passband of the transmit filter 240, into the middle of its stopband. The values of the cross-coupling capacitor 259 and the third inductor 257 determine how far the transmission zero is shifted upward in frequency from the upper passband edge. For example, in an embodiment, the values of the cross-coupling capacitor 259 and/or the third inductor 257 are selected such that the transmission zero will be shifted to be at or near the center frequency of the passband of the receive filter 220. This frequency placement of transmission zeroes (and poles) of the receive and transmit filters 220 and 240 achieves near-ideal elliptic filter performance of the duplexer 200.

Further, according to various embodiments, the duplexer 200 does not require any inductors larger than wirebond inductance external to the receive and transmit filters 220 and 240, but they may be used as matching elements to allow better performance for filters with constrained area to reduce die cost. For example, the maximum shunt resonator inductor is not more than about 0.7 nH, while in conventional duplexers, values as large as 3-4 nH are used. Accordingly, the size of the duplexer 200 (and/or receive and transmit filters 220 and 240) is smaller, and out-of-band rejection and in-band insertion loss are improved over resonator filters of conventional duplexers. Further, due to the elimination of the performance variation cause by external inductors, the configuration of the duplexer 200 will result in increased product yields.

Figure 3A:
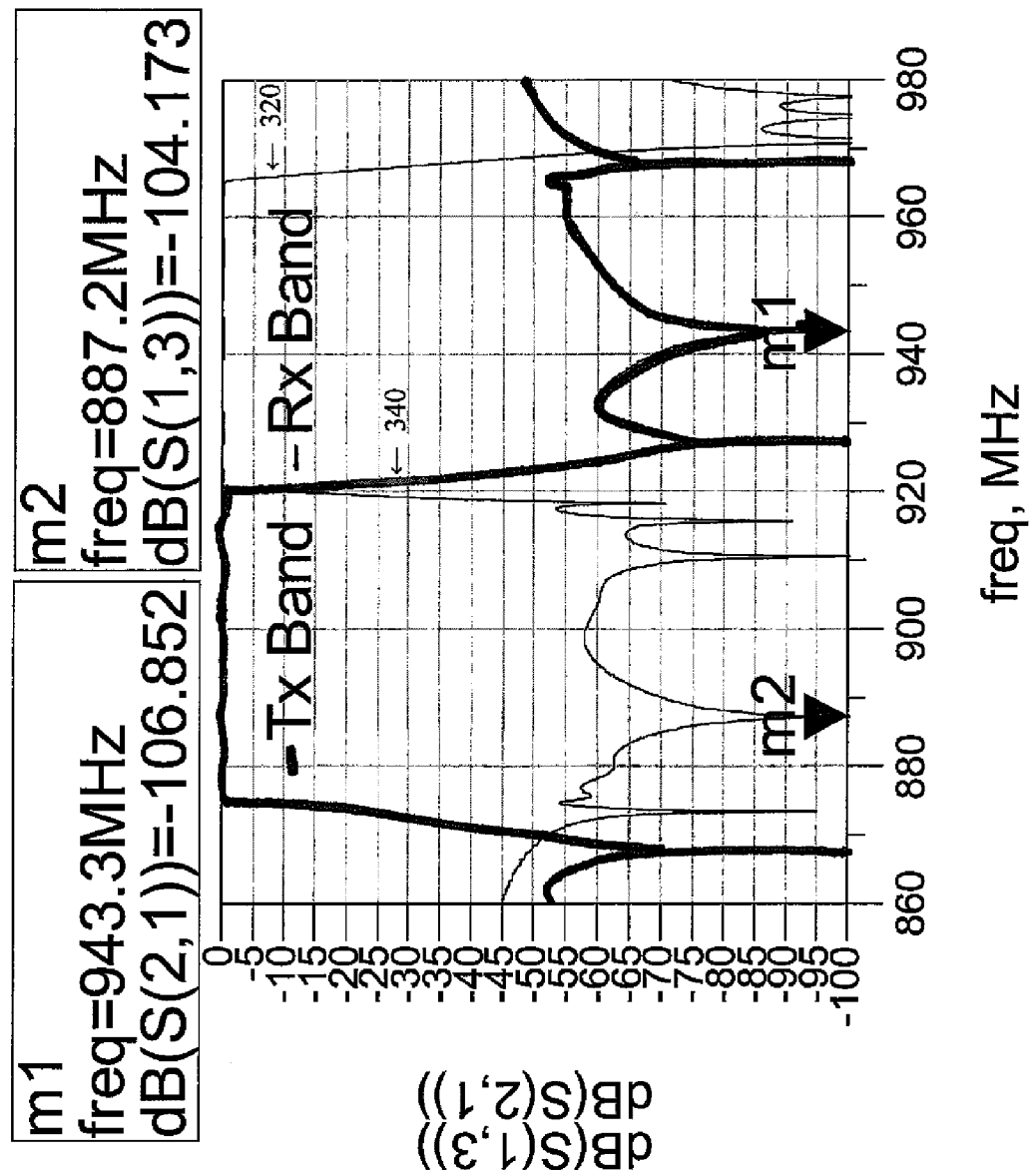
FIG. 3A is a signal diagram illustrating a simulated duplexer performance with cross-coupling elements, according to a representative embodiment.

FIG. 3A is a signal diagram illustrating simulated duplexer performance, showing representative frequency responses of the receive filter 220 and the transmit filter 240, according to a representative embodiment, assuming high quality factor resonators for illustrative purposes, with the cross-coupling elements for transmission zero shifting in the frequency response.

More particularly, FIG. 3A corresponds to an illustrative configuration of the duplexer 200 shown in FIG. 2, in which the common ground inductor 239 has a value of about 0.76 nH and the cross-coupling capacitor 259 has a value of about 0.53 pF. Also, the center frequency of the passband of the receive filter is assumed to be about 943.3 MHz and the center frequency of the passband of the transmit filter 240 is assumed to be about 887.2 MHz. The values of the inductors 235-238 may be between about 0.3 nH and 0.7 nH (typical wirebond values), and the values of the inductors 255-258 are in the same range. Each of the resonators 221-228 and 241-248 may be an FBAR, having areas in the range of about 1000-100,000 square microns, depending on the frequency and bandwidth requirements of the filters/duplexers and optimized impedance for each particular resonator. It is understood that, in various embodiments, the sizes and/or values of the resonators, inductors and cross-coupled capacitor may vary to provide unique benefits for any particular situation or to meet application specific design requirements of various implementations, as would be apparent to one skilled in the art.

Referring to FIG. 3A curve 340 shows the frequency response of the transmit filter 240, according to a representative embodiment, indicating forward transmission gain $S_{21}$ (in dB) as a function of transmitted signal frequency (in MHz). The passband of the transmit filter 240 is about 870 MHz-920 MHz. Curve 320 shows the frequency response of the receive filter 220, indicating reverse transmission loss $S_{23}$ (in dB) as a function of received signal frequency (in MHz). The passband of the receive filter 220 is about 920 MHz-970 MHz. Curve 340 shows that a transmission zero following initial roll-off of the in-band frequency response has been shifted, by operation of the cross-coupling capacitor 259, to about 943.3 MHz (indicated by m1), which substantially coincides with the center frequency of the receive filter 220. In the depicted example, the out-of-band attenuation at m1 for the transmit filter 240 is −106.852 dB. Likewise, curve 320 shows that a transmission zero after initial roll-off of the in-band frequency response of the receive filter 220 has been shifted, by operation of the common ground inductor 239, to about 887.2 MHz (indicated by m2), which substantially coincides with the center frequency of the transmit filter 220. In the depicted example, the out-of-band attenuation at m2 for the receive filter 220 is −104.173 dB.

Figure 3B:
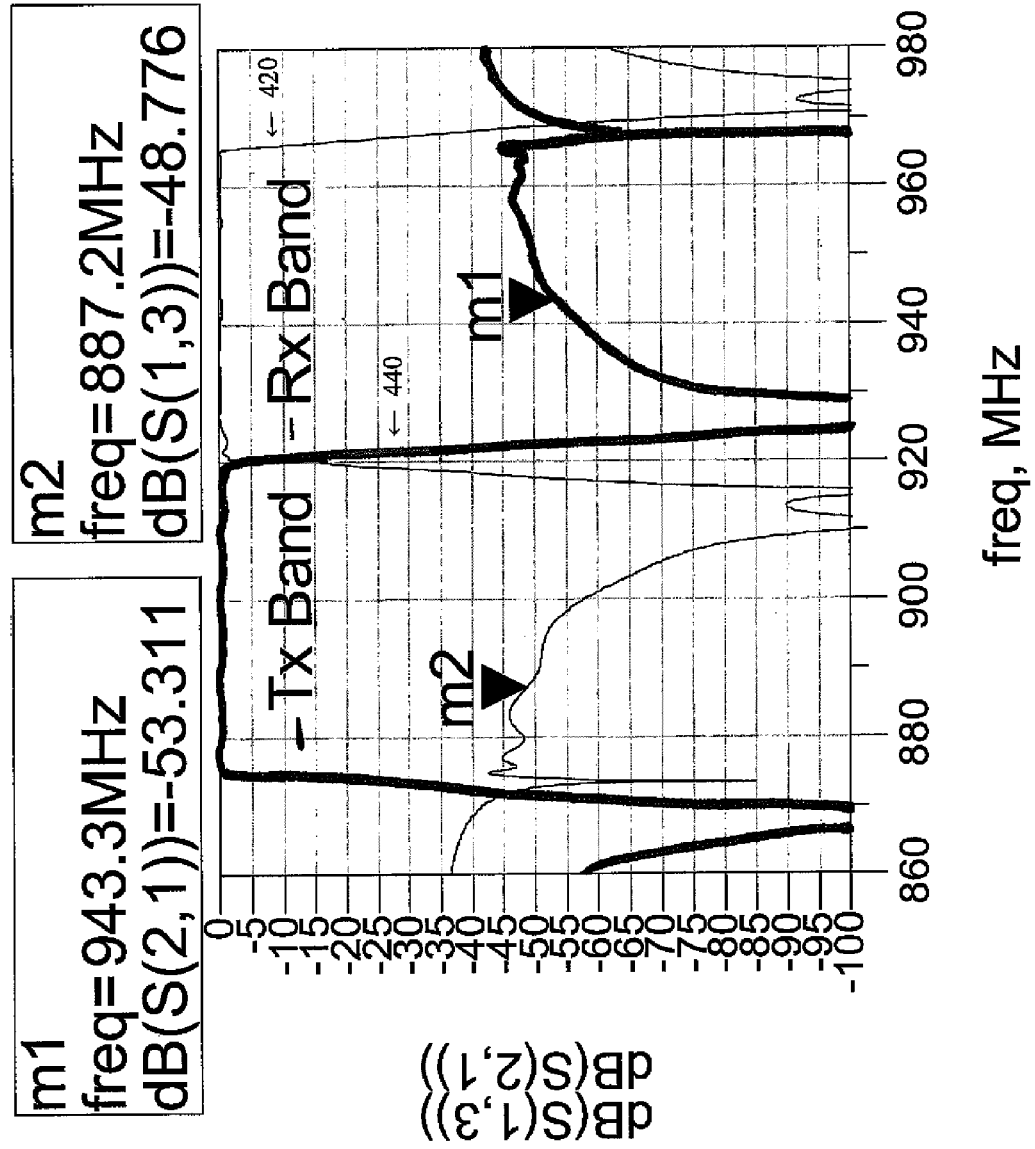
FIG. 3B is a signal diagram illustrating the simulated duplexer performance without the cross-coupling elements.

For purposes of comparison, FIG. 3B is a signal diagram illustrating simulated duplexer performance, showing representative frequency responses of receive and transmit filters, configured substantially the same as receive and transmit filters 220 and 240, as discussed above with reference to FIG. 3A, but without the cross-coupling elements, e.g., common ground inductor 239 and cross-coupling capacitor 259, respectively, that shift transmission zeroes to the middle of the rejection bands.

Curve 440 shows that a transmission zero following initial roll-off of the in-band frequency response occurs at about 928 MHz, which is at the edge of the passband of the receive filter 220. Meanwhile, the frequency response of the transmit filter 240 at the center frequency of the receive filter 220 (indicated by m1) is significantly higher, with an out-of-band attenuation of −53.311 dB. Curve 420 shows that a transmission zero following initial roll-off of the in-band frequency response occurs at about 910 MHz, which is at the edge of the passband of the transmit filter 240. Meanwhile, the frequency response of the receive filter 220 at the center frequency of the transmit filter 240 (indicated by m2) is significantly higher, with an out-of-band attenuation of −48.776 dB. Thus, each of the receive filter 220 and the transmit filter 240 experiences large degradation in rejection level in the frequency of the other filter's passband.

The placement of the transmission zeros may be controlled by varying the respective values of the cross-coupling capacitor 259 and the common ground inductor 239, up to the corresponding centering values of 0.53 pF and 0.76 nH, as shown in FIG. 3A. That is, as the value of the cross-coupling capacitor 259 approaches 0.53 pF, the transmission zero moves upward, further into the stopband of the transmit filter 240 and the passband of the receive filter 220. Also, as the value of the common ground inductor 239 approaches 0.76 pF, the transmission zero moves downward further into the stopband of the receive filter 220 and the passband of the transmit filter 240. For example, at half values, where the cross-coupling capacitor 259 is about 0.26 pF and the common ground inductor 239 is about 0.38 nH, the frequency response of the transmit filter 240 at the center frequency of the receive filter 220 is about −59.684 dB and the frequency response of the receive filter 220 at the center frequency of the transmit filter 240 is about −54.576 dB.

Further, there are fewer manufacturing variables in fabricating the receive and transmit filters 220 and 240 than in conventional receive and transmit filters. Individual control over the resonator areas of resonators 221-228 and 241-248 and only two mass-loadings are needed to produce frequency shifts in some of the resonators. Mass loadings are deposited layers of material on specific resonators, depending on design, needed to move the corresponding resonant frequencies of these resonators. For example, in the representative embodiments of the receive and transmit filters 220 and 240 shown in FIG. 2, in addition to the coarse mass-loading used on all the shunt resonators, a second, much smaller mass-loading on the two middle series resonators (e.g., series resonators 242 and 243) and the first and last shunt resonators (e.g., shunt resonators 245 and 248) of the transmit filter 240, and the two middle series resonators (e.g., series resonators 222 and 223) and the last shunt resonator (e.g., shunt resonator 228) of the receive filter 220, suffice to give an extremely sharp transition from passband to stopband. Also, the representative design permits use of a minimum coupling coefficient for the required bandwidth, which enables a thinner piezoelectric layer and therefore smaller die sizes. Further, the same coupling coefficient may be used for all resonators 221-228 and 241-248 in the receive and transmit filters 220 and 240. It would otherwise be difficult to control relative resonator frequencies if different effective coupling coefficients on different resonators were needed, since piezoelectric layer thicknesses on resonators with different effective coupling constants must vary.

FIGS. 4 and 5 are circuit diagrams of transmit filters 440 and 540, respectively, according to additional representative embodiments. Like transmit filter 240, discussed above, transmit filters 440 and 540 are ladder filters with eight resonators and cross-coupling capacitors, and provide substantial rejection above passband, shifting transmission zeros further into the stopband. Transmit filters 240, 440 and 540 may also have fast roll-off on the high frequency side. Transmit filters 440 and 540 may be incorporated in duplexer 200, for example, in place of transmit filter 240. Transmit filters 440 and 450 may also be used as stand alone band-pass filters or may be incorporated in multiplexers or other devices.

Referring to FIG. 4, transmit filter 440 has a series circuit including first through fourth transmit filter series resonators 441-444 connected in series between the antenna terminal 115 and the transmitter terminal 150. The transmit filter 440 also has shunt circuits which respectively include first through fourth shunt resonators 445-448 and corresponding first through fourth inductors 455-458 generally connected between the series circuit and ground voltage. The series and shunt resonators 441-448, as well as the inductors 455-458, may substantially correspond to resonators 241-248 and inductors 255-258 discussed above with respect to FIG. 2, and thus the descriptions will not be repeated with respect to the transmit filter 440.

In the depicted representative embodiment, the transmit filter 440 includes a different connection of the cross-coupling capacitor than the transmit filter 240. In particular, fourth shunt resonator 448 has one end connected to the transmit terminal 150 and an opposite end connected to first capacitance node 451, which is connected to ground through fourth inductor 458. The first capacitance node is also connected to second capacitance node 460 through cross-coupling capacitor 459. The second capacitance node 460 is located between first and second series resonators 411 and 442. First shunt resonator 445 has one end connected to the second capacitance node 460 and an opposite end connected to ground through first inductor 455.

Referring to FIG. 5, transmit filter 540 has a series circuit including first through fourth transmit filter series resonators 541-544 connected in series between the antenna terminal 115 and the transmitter terminal 150. The transmit filter 540 also has shunt circuits which respectively include first through fourth shunt resonators 545-548 and corresponding first through fourth inductors 555-558 generally connected between the series circuit and ground voltage. The transmit filter 540 further includes an additional inductor, fifth inductor 560, discussed below. The series and shunt resonators 541-548, as well as the inductors 555-558, may substantially correspond to resonators 241-248 and inductors 255-258 discussed above with respect to FIG. 2, and thus the descriptions will not be repeated with respect to the transmit filter 540.

In the depicted representative embodiment, the transmit filter 540 includes yet another connection of the cross-coupling capacitor, different than that of the transmit filter 240. In particular, third shunt resonator 547 has one end connected between third and forth series resonators 543 and 544 and an opposite end connected to capacitance node 551 through fourth inductor 557. The capacitance node 551 is connected to ground through fifth inductor 460 and to the antenna terminal 115 through cross-coupling capacitor 559. In addition, the capacitance node 551 is also connected to first and second shunt resonators 545 and 546 through first and second inductors 555 and 556, respectively.

Figure 6A:
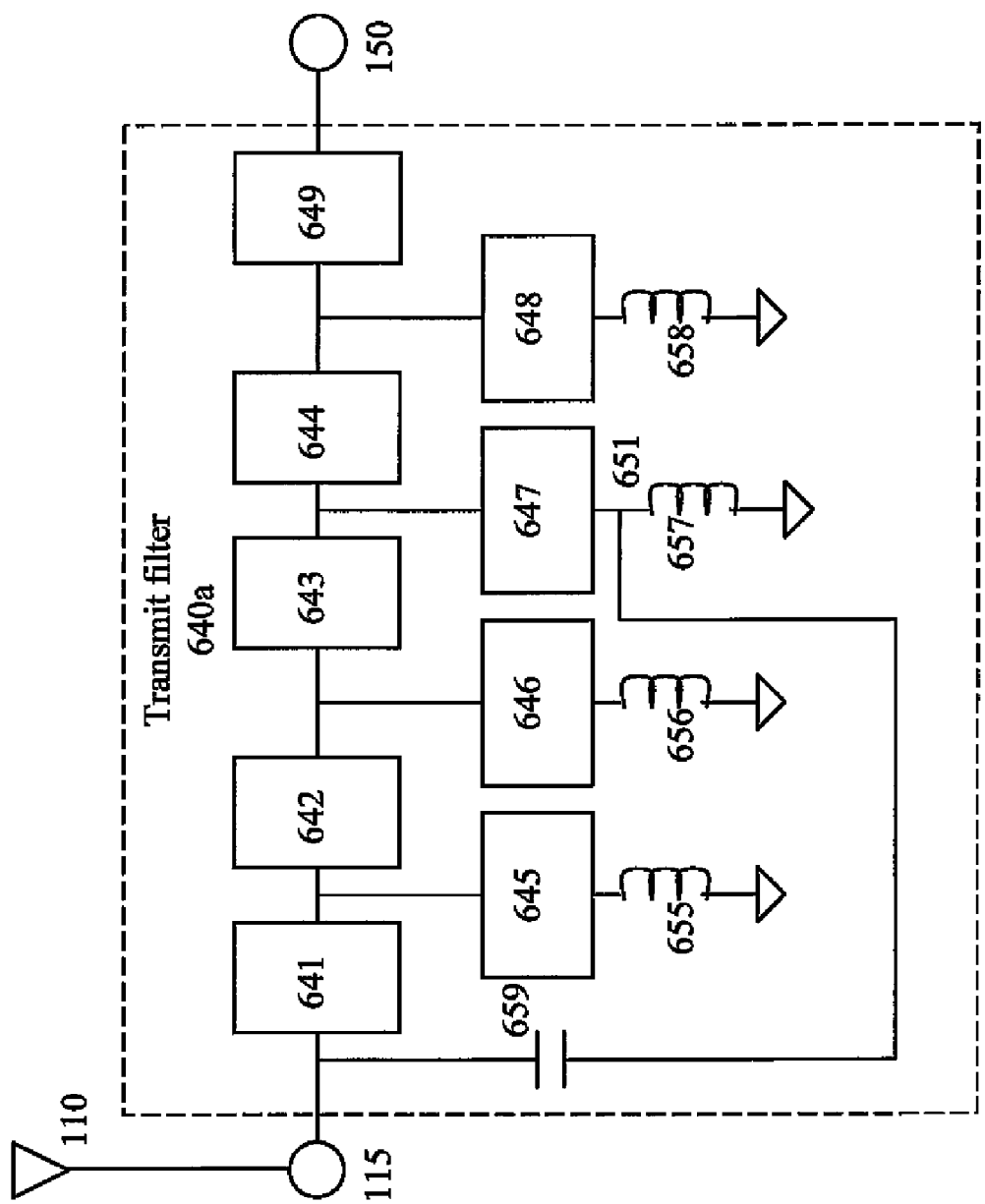
FIGS. 6A and 6B are circuit diagrams illustrating transmit resonator filters having nine resonators, according to a representative embodiment.
Figure 6B:
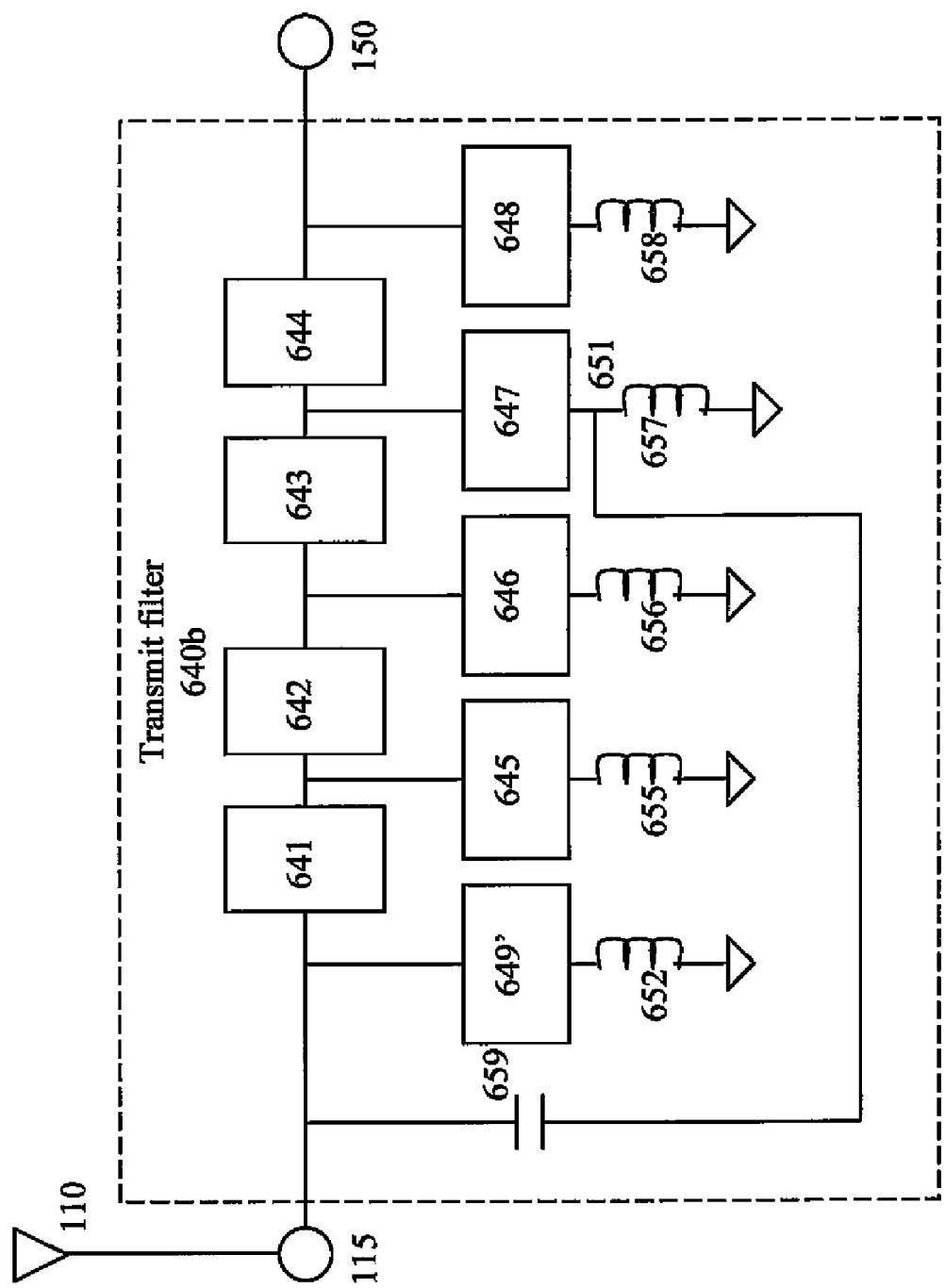

FIGS. 6A and 6B are circuit diagrams of transmit filters 640a and 640b, respectively, according to representative embodiments. Transmit filters 640a and 640b are ladder filters, similar to the transmit filter 240, discussed above with reference to FIG. 2, except that each includes an additional (ninth) resonator.

More particularly, referring to FIG. 6A, transmit filter 640a includes additional series resonator 649, which is connected in the series circuit between fourth series resonator 644 and transmitter terminal 150. Referring to FIG. 6B, transmit filter 640b includes additional shunt resonator 649', which is in an additional shunt circuit. The additional shunt resonator 649' has one end connected between the antenna terminal 115 and first series resonator 642 and an opposite end connected to ground through additional inductor 652. The other series and shunt resonators 641-648, as well as inductors 655-658, may substantially correspond to resonators 241-248 and inductors 255-258 discussed above with respect to FIG. 2, and thus the descriptions will not be repeated with respect to the transmit filter 640a or transmit filter 640b.

In additional representative embodiments, the transmit filters 440 and 540 shown in FIGS. 4 and 5, respectively, may be configured to include a ninth resonator, as a series or shunt resonator, in the same manner depicted in FIGS. 6A and 6B, which reference the transmit filter 240 of FIG. 2. Further, the cross-coupled capacitor 559 in the transmit filter 540 of FIG. 5 may alternately be connected to the node between resonators 541 and 542 and the common ground inductor 560 if inductor 555 were separately grounded and inductor 558 were joined to inductors 556 and 557 at the ungrounded node of inductor 560. Further, it is understood that with respect to the various embodiments discussed herein, the antenna terminal 115 and the transmitter terminal 150 may have the opposite positions with respect to the layout of the transmit filters, without departing from the scope of the present teachings. Also, in the various embodiments, the sizes and/or values of the resonators and cross-coupled capacitors may vary to provide unique benefits for any particular situation or to meet application specific design requirements of various implementations, as would be apparent to one skilled in the art.

FIGS. 7 and 8 are circuit diagrams of receive filters 720 and 820, respectively, according to additional representative embodiments. Like receive filter 220, discussed above, receive filters 720 and 820 are ladder filters with eight resonators and mutual inductance or common ground inductors, and provide substantial rejection below passband, shifting transmission zeros further into the stopband. Receive filters 240, 720 and 820 may also have fast roll-off on the low frequency side. Receive filters 720 and 820 may be incorporated in duplexer 200, for example, in place of receive filter 240. Receive filters 720 and 450 may also be used as stand alone band-pass filters or may be incorporated in multiplexers or other devices.

Referring to FIG. 7, receive filter 720 has a series circuit including first through fourth receive filter series resonators 721-724 connected in series between the antenna terminal 115 and the receiver terminal 130. It is understood that, although not depicted in FIG. 7, a phase shifter or matching circuit is included between node 733 and the antenna terminal 115, depending on implementation and design requirements. The receive filter 720 also has shunt circuits which respectively include first through fourth shunt resonators 725-728 and corresponding first through fourth inductors 735-738 generally connected between the series circuit and ground voltage. The series and shunt resonators 721-728, as well as the inductors 725-728, may substantially correspond to resonators 221-228 and inductors 235-238 discussed above with respect to FIG. 2, and thus the descriptions will not be repeated with respect to the receive filter 720.

In the depicted representative embodiment, the receive filter 720 includes a different connection of the common ground inductor 739 than the receive filter 240. In particular, first shunt resonator 725 has one end connected to node 733 and an opposite end connected to mutual inductance node 732 through first inductor 735. Similarly, second shunt resonator 726 has one end connected between second and third series resonators 721 and 722 and an opposite end connected to the mutual inductance node 232 through second inductor 736. The mutual inductance node 732 is connected to ground through mutual or common ground inductor 739.

In another embodiment of a receive filter (not shown), similar to receive filters 220 and 720 in FIGS. 2 and 7, the mutual inductance node (e.g., 732) is connected to the second and third shunt resonators (e.g., 726 and 727) through second and third inductors (e.g., 736 and 737), respectively. As in the other embodiments, the mutual inductance node is connected to ground through a common ground inductor (e.g., 739).

Referring to FIG. 8, receive filter 820 has a series circuit including first through fourth receive filter series resonators 821-824 connected in series between the antenna terminal 115 and the receiver terminal 130. It is understood that, although not depicted in FIG. 8, a phase shifter or matching circuit is included between node 833 and the antenna terminal 115, depending on implementation and design requirements. The receive filter 820 also has shunt circuits which respectively include first through fourth shunt resonators 825-828 and corresponding first through fourth inductors 835-838 generally connected between the series circuit and ground voltage. The series and shunt resonators 821-828, as well as the inductors 825-828, may substantially correspond to resonators 221-228 and inductors 235-238 discussed above with respect to FIG. 2, and thus the descriptions will not be repeated with respect to the receive filter 820.

In the depicted representative embodiment, the receive filter 820 includes two mutual or common ground inductors 834 and 839. In particular, first shunt resonator 825 has one end connected to node 833 and an opposite end connected to first mutual inductance node 832 through first inductor 835, and second shunt resonator 826 has one end connected between first and second series resonators 821 and 822 and an opposite end connected to the first mutual inductance node 832 through second inductor 836. Similarly, third shunt resonator 827 has one end connected between second and third series resonators 822 and 823 and an opposite end connected to second mutual inductance node 831 through third inductor 837, and fourth shunt resonator 828 has one end connected between third and fourth series resonators 823 and 824 and an opposite end connected to the second mutual inductance node 832 through fourth inductor 838. The first mutual inductance node 832 is connected to ground through common ground inductor 839, and the second mutual inductance node 831 is connected to ground through second common ground inductor 834.

Figure 9A:
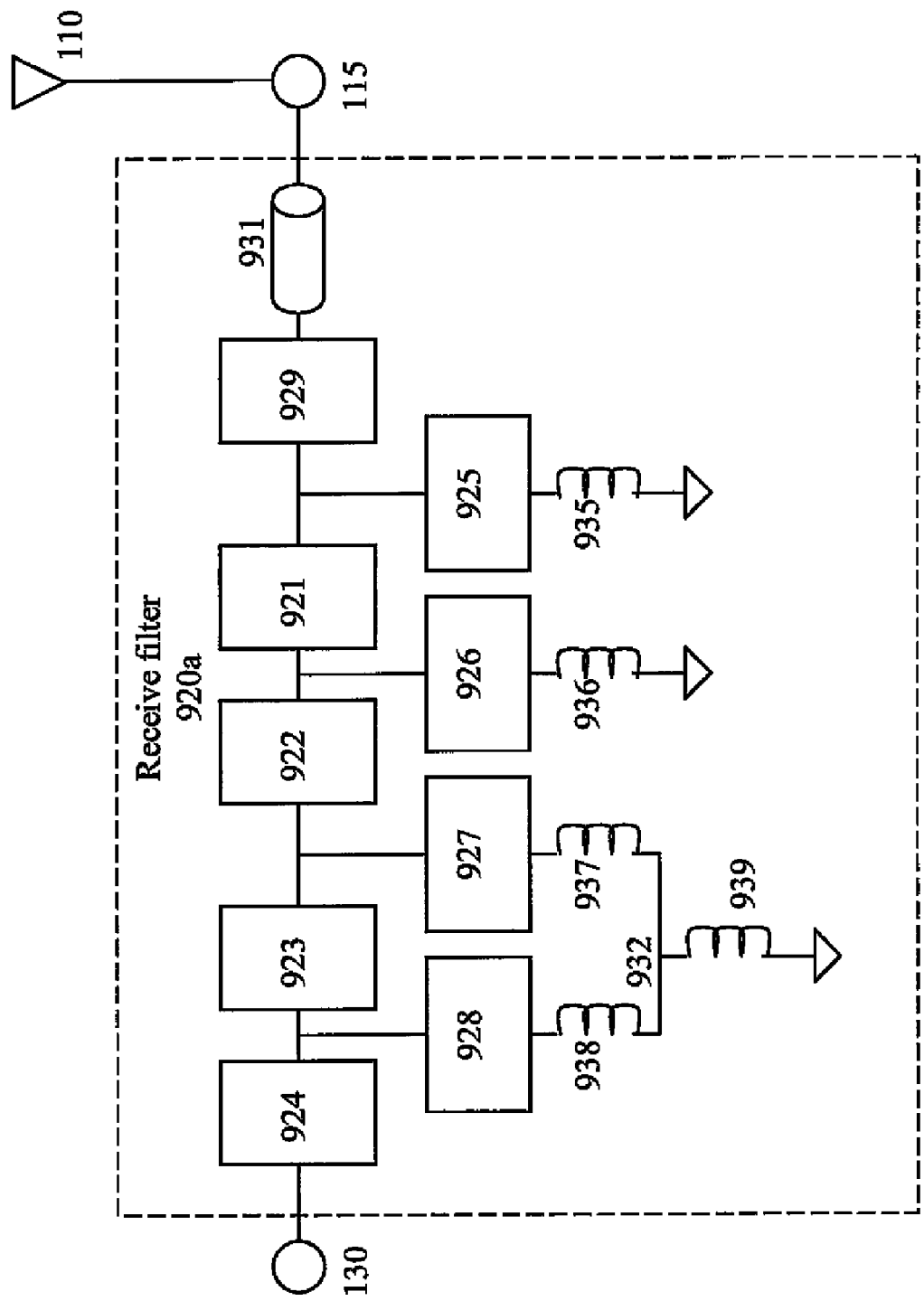
FIGS. 9A and 9B are circuit diagrams illustrating transmit resonator filters having nine resonators, according to a representative embodiment.
Figure 9B:
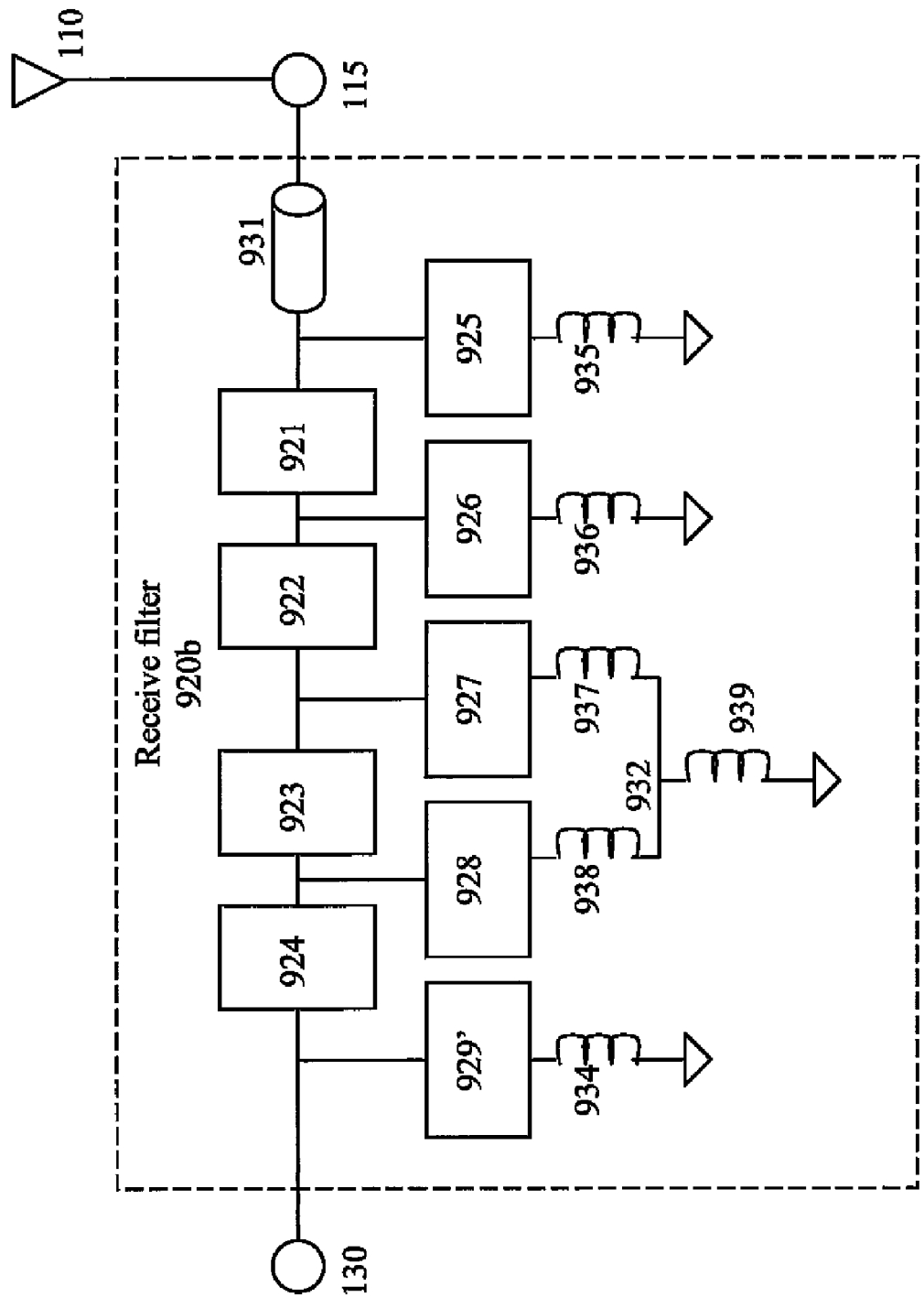

FIGS. 9A and 9B are circuit diagrams of receive filters 920a and 920b, respectively, according to representative embodiments. Receive filters 920a and 920b are ladder filters, similar to the receive filter 220, discussed above with reference to FIG. 2, except that each includes an additional (ninth) resonator.

More particularly, referring to FIG. 9A, receive filter 920a includes additional series resonator 929, which is connected in the series circuit between first series resonator 921 and phase shifter 931, which is connected in series with the antenna terminal 115. Referring to FIG. 9B, receive filter 920b includes additional shunt resonator 929', which is in an additional shunt circuit. The additional shunt resonator 929' has one end connected between the receiver terminal 130 and fourth series resonator 924 and an opposite end connected to ground through additional inductor 934. The other series and shunt resonators 921-928, as well as inductors 935-938, may substantially correspond to resonators 241-248 and inductors 255-258 discussed above with respect to FIG. 2, and thus the descriptions will not be repeated with respect to the receive filter 920a or receive filter 920b.

In additional representative embodiments, the receive filters 720 and 820 shown in FIGS. 7 and 8, respectively, may be configured to include ninth series or shunt resonators in the same manner depicted in FIGS. 9A and 9B, which reference the receive filter 240 of FIG. 2. Further, it is understood that with respect to the various embodiments discussed herein, the antenna terminal 115 and the receiver terminal 130 may have the opposite positions with respect to the layout of the receive filters, without departing from the scope of the present teachings. Also, in the various embodiments, the sizes and/or values of the resonators and inductors may vary to provide unique benefits for any particular situation or to meet application specific design requirements of various implementations, as would be apparent to one skilled in the art.

The improved performance of the various embodiments discussed above over conventional transmit and receive filters, e.g., for use in duplexers, multiplexers and the like, is particularly beneficial where a very fast roll-off from passband to stopband is required, e.g., due to a very narrow guard band, such as in the UMTS band 2 (PCS band), UMTS band 3 (GCS), UMTS band 7 (IMT-E) and UMTS band 8 (GSM-900). Of course, it is understood that various embodiments may be scaled, for example, to cover all UMTS bands, even when fast roll-off is not needed.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A duplexer interfacing a receiver and a transmitter with a common antenna, the duplexer comprising: a first filter comprising at least four first series resonators connected in series between the antenna and one of the receiver and the transmitter, four first shunt resonators respectively connected between at least one of the four first series resonators and ground voltage, and a mutual inductance commonly connected between two adjacent first shunt resonators; and a second filter comprising at least four second series resonators connected in series between the antenna and one of the transmitter and the receiver, four second shunt resonators respectively connected between at least one of the four second series resonators and the ground voltage, and a cross-coupling capacitor connected between a first capacitor node connected to at least one of the second series resonators and a second capacitor node connected to one of the second shunt resonators, and an inductor connected in series between second capacitor node and ground, wherein three of the at least four second series resonators and the one of the second shunt resonators to which the cross-coupling capacitor is connected are positioned between the first capacitor node and the second capacitor node.

2. The duplexer of claim 1, wherein the first filter has a first passband, the mutual inductance causing a first transmission zero to shift lower in frequency from a lower edge of the first passband.

3. The duplexer of claim 1, wherein the second filter has a second passband, the inductor and the cross-coupling capacitor causing a second transmission zero to shift higher in frequency from an upper edge of the second passband.

4. The duplexer of claim 1, wherein the first filter further comprises a phase shifter connected between the antenna and a first series resonator connected closest to the antenna.

5. The duplexer of claim 1, wherein each of the first and second series resonators and the first and second shunt resonators comprises a film bulk acoustic resonator (FBAR), a bulk acoustic wave (BAW) resonator or a surface acoustic wave (SAW) device.

6. The duplexer of claim 5, wherein each of the first and second series resonators and the first and second shunt resonators comprises a solidly mounted resonator (SMR).

7. The duplexer of claim 1, wherein the first and second series resonators and first and second shunt resonators are fabricated using a common layer of piezoelectric material.

8. The duplexer of claim 1, wherein the cross-coupling capacitor is fabricated on a common substrate as the first series and shunt resonators.

9. The duplexer of claim 1, wherein the mutual inductance comprises a common ground inductor connecting the two adjacent first shunt resonators to ground.

10. The duplexer of claim 1, wherein the first and second filters are ladder filters integrally mounted in a same package.

11. The duplexer of claim 1, wherein the first and second series resonators and the first and second shunt resonators have the same coupling coefficient.

12. The duplexer of claim 1, wherein the first filter further comprises four first inductors respectively connected between the four first shunt resonators and the ground voltage, and
wherein the second filter further comprises four second inductors respectively connected between the four second shunt resonators and the ground voltage.

13. The duplexer of claim 9, wherein the common ground inductor is about 0.76 nH and the cross-coupling capacitor is about 0.53 pF.

14. The duplexer of claim 1, wherein the first filter further comprises a phase shifter connected between the antenna and a first series resonator connected closest to the antenna.

15. A duplexer comprising: an antenna terminal connected to an antenna; a transmit terminal connected to a transmitter configured to send a transmit signal through the antenna terminal; a receive terminal connected to a receiver configured to receive a receive signal through the antenna terminal; a transmit ladder filter connected between the antenna terminal and the transmit terminal, the transmit filter comprising first through fourth transmit series resonators connected in series between the antenna terminal and the transmit terminal, first through fourth transmit shunt resonators respectively connected between the first through fourth transmit series resonators and a ground voltage, and a cross-coupling capacitor connected between the third transmit shunt resonator and the antenna terminal; and a receive ladder filter connected between the antenna terminal and the receive terminal, the receive filter comprising a phase shifter and first through fourth receive series resonators connected in series between the phase shifter and the receive terminal, first through fourth receive shunt resonators respectively connected between the first through fourth receive series resonators and the ground voltage, and a common ground inductor commonly connected between the ground voltage and the third and fourth receive shunt resonators, wherein the cross-coupling capacitor shifts a transmission zero of the transmit signal toward a center frequency of a receive passband of the receive filter.

16. The duplexer of claim 15, wherein the common ground inductor shifts a transmission zero of the receive signal toward a center frequency of a transmit passband of the transmit filter.

17. The duplexer of claim 16, wherein each of the transmit and receive series resonators and the transmit and receive shunt resonators comprises one of a film bulk acoustic resonator (FBAR), a bulk acoustic wave (BAW) resonator, or a surface acoustic wave (SAW) device.

18. The duplexer of claim 17, wherein the transmit series and shunt resonators are fabricated using a first common layer of piezoelectric material, and
wherein the receive series and shunt resonators are fabricated using a second common layer of piezoelectric material.

19. A duplexer for interfacing a receiver and a transmitter with a common antenna, the duplexer comprising:
a receive ladder filter connected between the antenna and the receiver, the receive ladder filter comprising receive series resonators and receive shunt resonators, a first receive shunt resonator comprising a first electrode connected between the antenna and a first series resonator and a second electrode connected to ground, a second receive shunt resonator comprising a third electrode connected between the first receive series resonator and a second receive series resonator and a fourth electrode connected to ground, a third receive shunt resonator comprising a fifth electrode connected between the second receive series resonator and a third receive series resonator and a sixth electrode connected to a common ground inductor, and a fourth receive shunt resonator comprising a seventh electrode connected between the third receive series resonator and a fourth receive series resonator and an eighth electrode connected to the common inductor, the common inductor being connected to ground; and a transmit ladder filter connected between the antenna and the transmitter, the transmit ladder filter comprising transmit series resonators and transmit shunt resonators, a first transmit shunt resonator comprising a first electrode connected between a first transmit series resonator and a second transmit series resonator and a second electrode connected to ground, a second transmit shunt resonator comprising a third electrode connected between the second transmit series resonator and a third transmit series resonator and a fourth electrode connected to ground, a third transmit shunt resonator comprising a fifth electrode connected between the third receive series resonator and a fourth transmit series resonator and a sixth electrode connected to a capacitor node, and a fourth transmit shunt resonator comprising a seventh electrode connected between the fourth transmit series resonator and the transmitter and an eighth electrode connected to ground, wherein the capacitor node is connected to ground through an inductor and to the antenna via a cross-coupling capacitor.

20. The duplexer of claim 19, wherein the common inductor of the receive ladder filter shifts a transmit zero of a received signal to a lower frequency, and wherein the cross-coupling capacitor of the transmit ladder filter shifts a transmit zero of a transmitted signal to a higher frequency.

* * * * *